United States Patent [19]

Hattori et al.

[11] Patent Number: 5,070,035
[45] Date of Patent: Dec. 3, 1991

[54] METHOD FOR PRODUCING A III-V COMPOUND SEMICONDUCTOR DEVICE WITH A PHOSPHORIC OXIDE INSULATING LAYER

[75] Inventors: Kazuo Hattori, Toyohashi; Mitsuhiro Taniguchi, Toda, both of Japan

[73] Assignee: Nippon Mining Co., Ltd., Tokyo, Japan

[21] Appl. No.: 415,306

[22] PCT Filed: Jan. 24, 1989

[86] PCT No.: PCT/JP89/00060

§ 371 Date: Aug. 21, 1989

§ 102(e) Date: Aug. 21, 1989

[87] PCT Pub. No.: WO89/06863

PCT Pub. Date: Jul. 27, 1989

[30] Foreign Application Priority Data

Jan. 25, 1988 [JP] Japan .................................. 63-15286
Apr. 4, 1988 [JP] Japan .................................. 63-83297

[51] Int. Cl.⁵ .......................................... H01L 21/441
[52] U.S. Cl. .................................. 437/184; 437/194; 437/195; 437/913
[58] Field of Search ............... 437/184, 194, 195, 913, 437/922, 912, 247

[56] References Cited

U.S. PATENT DOCUMENTS 3,438,121 4/1969 Wanlass et al. .
4,172,158 10/1979 Li .
4,731,293 3/1988 Ekholm et al. ........................ 437/37
4,960,718 10/1990 Aina .................................... 437/912

FOREIGN PATENT DOCUMENTS 2454183 11/1980 France ................................ 437/913

OTHER PUBLICATIONS

T. Sawada, et al., "InP MISFET's with Al₂O₃/Native Oxide Double-Layer Gate Insulators", IEEE Trans. on Electron Devices, vol. ED. 31, #8, Aug. '84, pp. 1038–1043.

H. L. Chang, et al., "Preparation and Electrical Properties of $InP_xO_y$ Gate Insulators on InP", Appl. Phys. Lett. 48 (5), 3 Feb. 1986, pp. 375–377.

"InP High Mobility Enhancement MISFET's Using Anodically Grown Double-Layer Gate Insulator", #8093—Electronics Letters, vol. 18 (1982) #17, pp. 742–743.

P. O'Connor, T. P. Pearsall, K. Y. Cheng, A. Y. Cho, J. C. M. Hwang, K. Alavi, "$In_{0.53}Ga_{0.47}As$ FET's with Insulator-Assisted Schottky Gates", IEEE Electron Device Letters, vol. EDL-3, No. 3 (Mar. '82) pp. 64–66.

Primary Examiner—Brian E. Hearn
Assistant Examiner—Linda J. Fleck
Attorney, Agent, or Firm—McAulay Fisher Nissen Goldberg & Kiel

[57] ABSTRACT

A method for producing a semiconductor device according to the present invention comprises the following steps. A $P_xO_y$ ($x>0$, $y>0$) insulating layer is formed on III-V group compound semiconductor substrate including indium and/or phosphorus. Then the substrate is subjected to heat treatment, and finally an electrode metal layer is formed on the insulating layer. This method ensures to increase the barrier height of MES type diode and the forward current-voltage characteristics of Schottky diode. Further, another method of the present invention comprises the following steps. An aluminum or indium layer is formed on III-V group compound semiconductor substrate including indium or phosphorus. The substrate is subjected to a first heat treatment. Then an insulating layer composed of phosphoric oxide $P_xO_y$ ($x>0$, $y>0$) is formed on the aluminum or indium layer. Further, the substrate is subjected to a second heat treatment, and finally an electrode metal layer is formed on the insulating layer. This method ensures to decrease the interface trap density of MIS type semiconductor device, and thus to improve the capacitance-voltage characteristic of MIS type semiconductor device.

9 Claims, 7 Drawing Sheets (A)

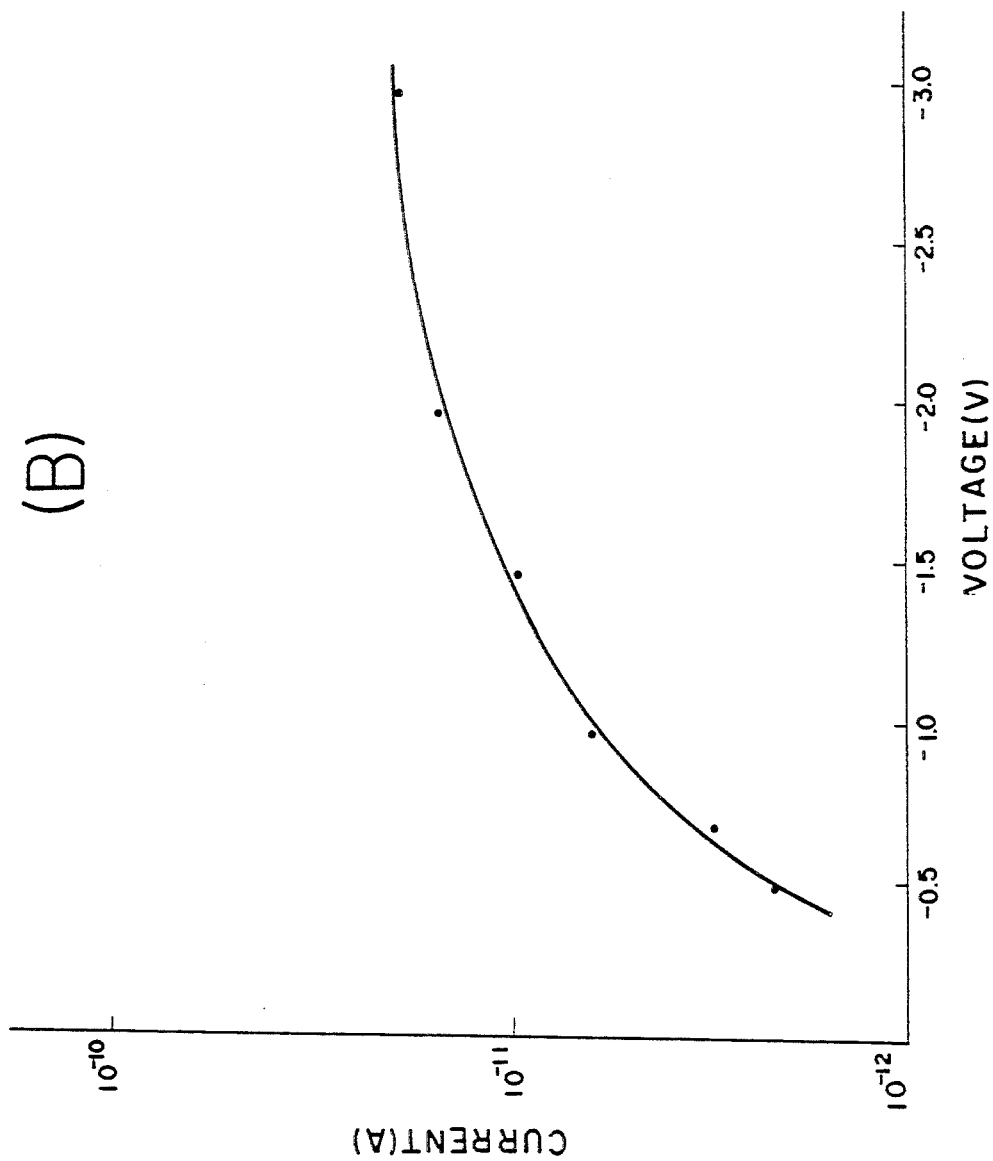

METHOD FOR PRODUCING A III-V COMPOUND SEMICONDUCTOR DEVICE WITH A PHOSPHORIC OXIDE INSULATING LAYER

TECHNICAL FIELD

The present invention relates to a method for producing a compound semiconductor device, and more particularly to an effective technique adapted for producing compound semiconductor devices for example an InP semiconductor substrate on which a MES (Metal Semiconductor) type diode, a MIS (Metal Insulator Semiconductor) type diode, a MES type field effect transistor FET, or a MIS type field effect transistor is fabricated.

BACKGROUND TECHNIQUE

Compound semiconductors such as GaAs, InP and so on have been expected to be used as high speed devices because their electron mobility and saturation drift velocity are higher than Si (silicon). Already GaAs MES-FET (Metal Semiconductor Field Effect Transistor) has been practically used.

Although superior properties were expected of InP, such superior properties in comparison with GaAs, InP have not been practically used for producing MESFET on account of high barrier height and difficulty in producing a Schottky junction with small reverse leakage current.

Conventionally, several attempts to interpose a thin insulating layer such as $Al_2O_3$, $SiO_2$ having a thickness of about 30 Å between an InP and a gate electrode metal have been proposed in order to improve the barrier height of a Schottky diode made of InP.

However, such various attempts have provided only an InP Schottky diode with a barrier height $\Phi B$ of at its highest of 0.5 eV obtained from current-voltage characteristic, or large reverse leakage current. Further a conventional Schottky diode was possessed of poor properties such as an ideal factor n = 1.5 to 2.0 representing completeness of the Schottky contact. The ideal factor n is deduced from the following equation representing the relationship between a forward current and voltage of the Schottky diode;

$$I = Io\left(\exp\frac{qV}{nkT} - 1\right) \quad (1)$$

where, the saturation current Io is represented by following equation;

$$Io = AT^2 \exp\frac{-q\Phi B}{kT} \quad (2)$$

where, A represents the Richardson constant.

On the other hand, the general phenomena of semiconductor devices, the condition of the semiconductor surface remarkably influences characteristics of the semiconductor device. In a silicon semiconductor device, the density of interface trap density between Si and $SiO_2$ layers is remarkably low and its insulating layer per se is stable so that good characteristics of a semiconductor device can be provided. However, a required insulating layer having a low interface trap density for a compound semiconductor has not yet been provided.

For example, various materials such as evaporated SiO and CVD-$SiO_2$ (Chemical Vapor Deposition) have been studied for a long period of time in connection with use thereof as an insulating layer for the InP made MIS diode or MISFET. They do not possess a low interface trap density and a small current drift. In recent years, some attempts have been made to produce a special insulating layer (for example, AlPxOy) including the V-group elements by means of a thermal CVD method in order to control V-group elements.

In the insulating layer grown by using a hot CVD method, however, the surface of InP semiconductor should be exposed to high temperatures from 300° to 450° C. immediately prior to the formation of an insulating layer. This will possibly cause a decomposition of the InP semiconductor surface and vapor phosphorus thereby resulting in a problem for controlling the V-group elements. As a result, this method has not provided a desired insulating layer with an excellent interface property.

It is an object of the present invention to provide a method for producing an InP-made Schottky diode with a high barrier height and an excellent current-voltage characteristics.

Another object of the present invention is to provide a method for producing a semiconductor device including a III-V group (indium and/or phosphorus) compound semiconductor which ensures a decrease in the density of the state at the surface of the device, improves the capacitance-voltage characteristics of a MIS type diode, and provides a MISFET with a good performance.

DESCRIPTION OF THE INVENTION

To accomplish the above set forth first object, the present invention provides a method comprising a first step for forming a phosphoric oxide PxOy (where X>0, and Y>0) insulating layer on a III-V group compound semiconductor substrate essentially consisting of indium and/or phosphorus, a second step for the formed insulating layer, and a third step for forming an electrode metal layer on the insulating layer.

In this method, the III-V group compound semiconductor essentially consists of indium and/or phosphorus and these are selected from InP, InSb, InAs, GaP, InGaAs, InGaP, InGaAsP and so on.

To accomplish the second-mentioned object, the present invention provides a method comprising a first step for forming an aluminium layer or an indium layer on a III-V group compound semiconductor essentially consisting of indium and/or phosphorus, a second step for heat-treating the formed layer, a third step for forming a phosphoric oxide PxOy (where X>0, and Y>0) insulating layer on the aluminium layer or the indium layer, a fourth step for heat-treating the formed layer, and a fifth step for forming an electrode metal layer on the insulating layer.

In this method, the III-V group compound semiconductor essentially consists of indium and/or phosphorus which are selected from InP, InSb, InAs, GaP, InGaAs, InGaP, InGaAsP and so on.

BEST MODE OF EMBODIMENT OF THE INVENTION

1. First Embodiment

Figure 1:
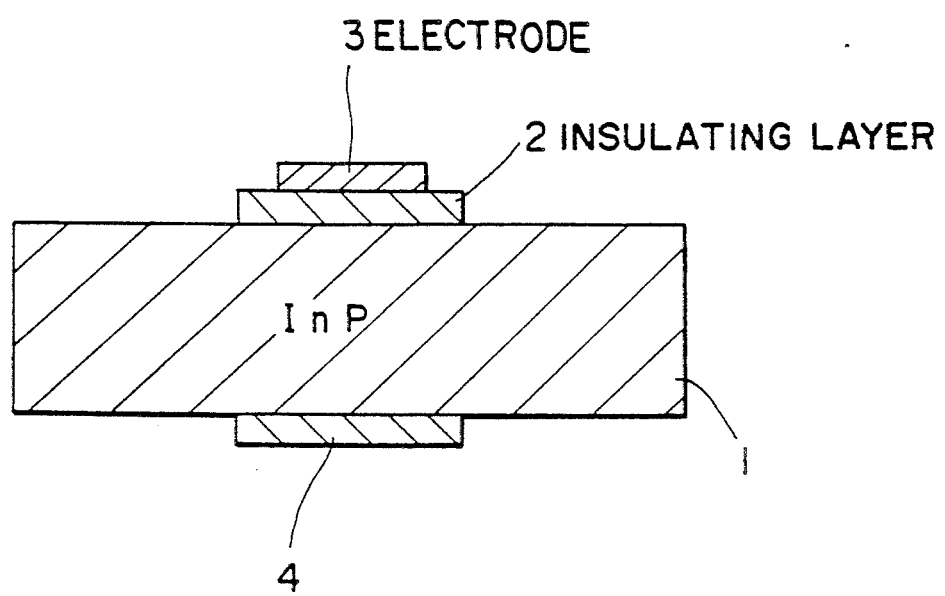
FIG. 1 is a cross sectional view showing one embodiment of Schottky diode used for a semiconductor device produced by a method according to the present invention.

FIG. 1 shows a cross sectional view of the Schottky diode which is an example of the semiconductor device produced by the method according to the present invention.

In this embodiment, an ohmic electrode 4 made of AuGe layer is firstly deposited on the back side of the n-type InP substrate 1 having a carrier density of about $7.3 \times 10^{15}$ cm$^{-3}$.

Next step, a $P_2 O_5$ compound as a source material is evaporated by means resistance heater in an atmosphere of nitrogen to deposit a PxOy layer 2 on the front surface of the InP substrate. The thickness of the deposited layer 2 is about 70 Å. After this step, the InP substrate is subjected to heat treatment at a temperature of 250° C. for a period of 20 minutes in an atmosphere of dry oxygen.

Then the InP substrate is transferred from the oxygen atmosphere into another nitrogen atmosphere where the substrate is subjected to a heat treatment at a temperature of 250° C. for about one hour.

On the insulating layer 2 a gold layer is deposited by evaporation and then the gold layer is subjected to a patterning to form the Au Schottky electrode 3 having a diameter of 1 mm. After completion of the various steps, the Schottky diode as shown in FIG. 1 has been produced.

The produced Schottky diode was measured in order to provide a forward current-voltage characteristic curve. The result is shown in FIG. 2(A).

The resultant values were substituted into the above mentioned equations (1) and (2) representing the forward current-voltage characteristic to obtain the ideal factor "n" and the barrier height Φ B. The resulted values were n = 1.18 and Φ B = 1.05 eV.

According to the result, the ideal factor "n" of this embodiment of the Schottky diode is extremely close to "1", and thereby a suitable or perfect interface. On the other hand, conventional Schottky diode composed of an insulating layer such as $SiO_2$, $Al_2 O_3$ and an anodic oxidized layer having a thickness of about 30 Å interposed between the Schottky metal and the InP has provided a relatively high ideal factor "n" in the range from 1.5 to 2.0. Further the barrier height 1.05 eV provided by this embodiment is much higher than conventionally provided values 0.4 to 0.5 eV.

Figure 2:
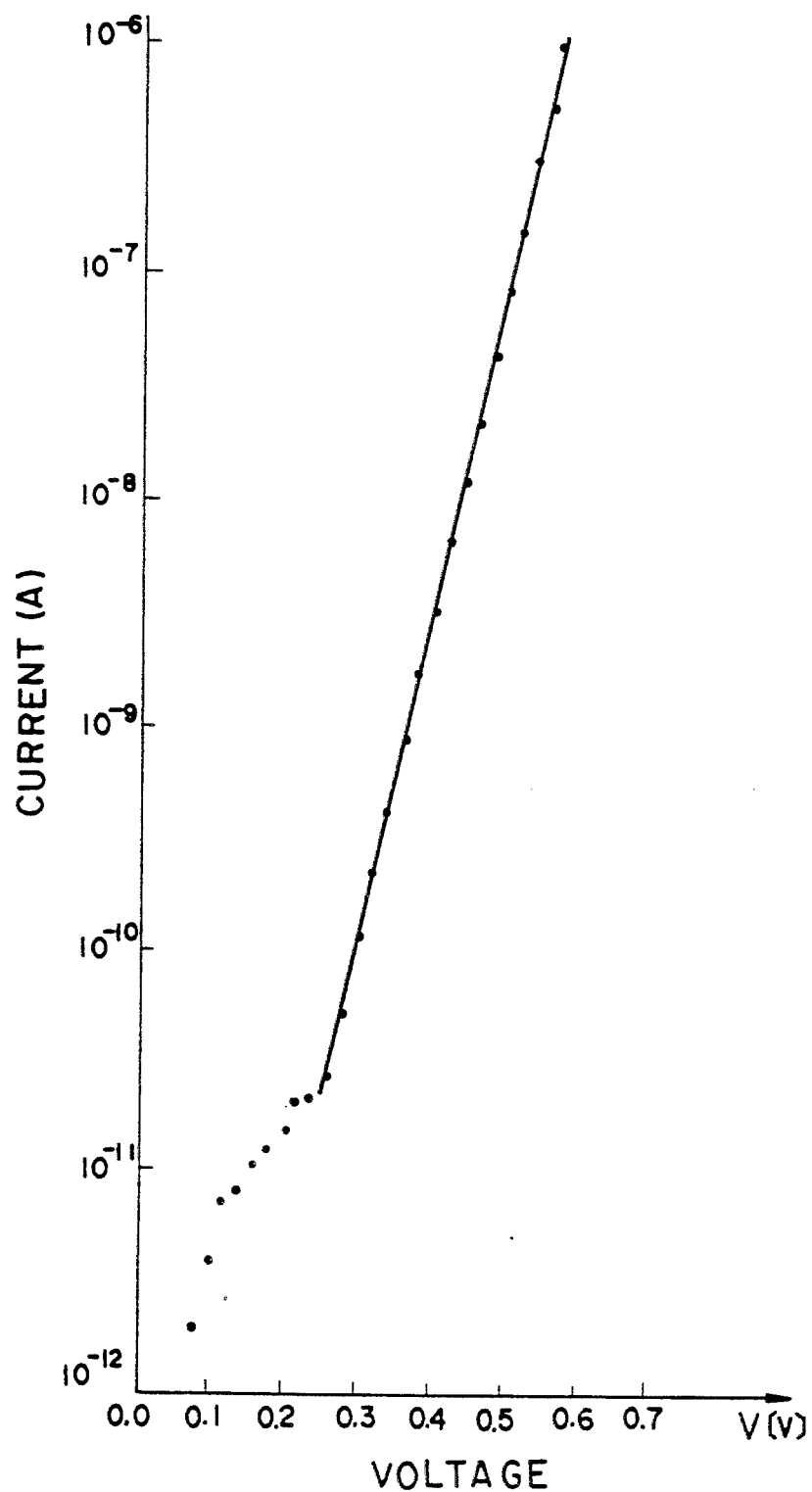
FIGS. 2(A) and 2(B) are graphs showing respectively the forward current-voltage characteristic curve and the reverse direction current-voltage characteristic curve of the Schottky diode, respectively.

The resultant reverse current-voltage characteristic of the Schottky diode produced by this embodiment is shown in FIG. 2(B).

The Schottky diode produced by this embodiment provides a small reverse leakage current and a superior rectifying function.

Although the producing method of this embodiment used gold for the electrode metal, this method may employ any suitable metal such as aluminium capable of generating a Schottky barrier on InP substrate.

2. Second Embodiment

A second embodiment relates to a producing method for MIS type diode.

In the same manner as the first embodiment, $P_2 O_5$ as source material is evaporated by resistance heating in an atmosphere of nitrogen to deposit a PxOy layer 2 on one surface of the InP substrate. The thickness of the deposited layer 2 is about 1200 Å. After this step, the InP substrate is subjected to a heat treatment at 200° C. for about one hour in an atmosphere of dry oxygen. Further the substrate is subjected to another heat treatment at a temperature of 400° C. for about 30 minutes in an atmosphere of nitrogen.

Then the other surface of the InP substrate 1 is provided with an ohmic electrode 4 made of Au—Sn layer by evaporation. On the insulating layer 2 an aluminium layer is deposited by evaporation and then the aluminium layer is subjected to a patterning to form an Al electrode 3 having a diameter of 1 mm. As a result, the MIS type diode is produced.

Figure 3:
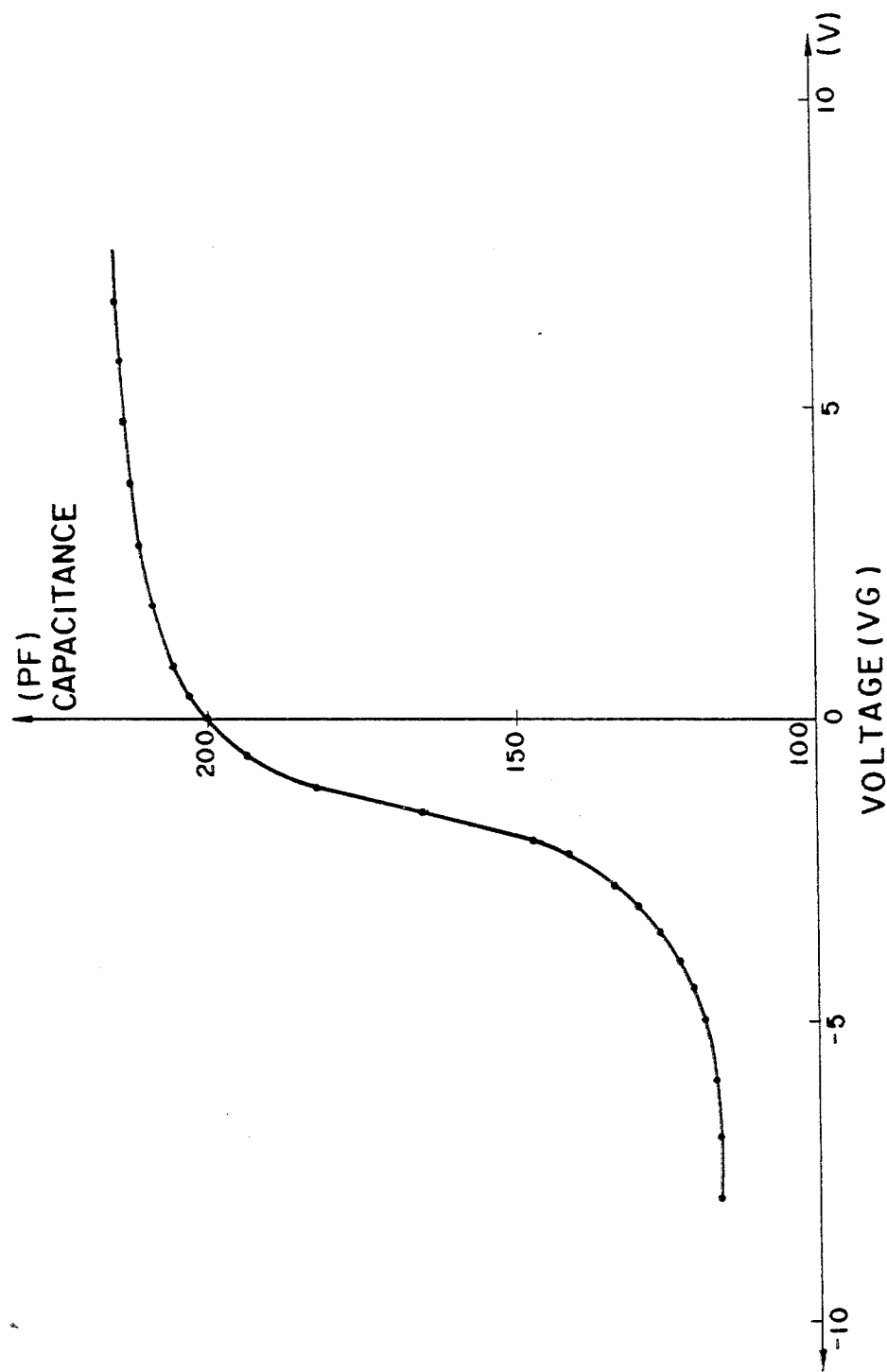
FIG. 3 is a graph showing the capacitance-voltage characteristic curve of a MIS type diode produced by a method according to the present invention.
Figure 4:
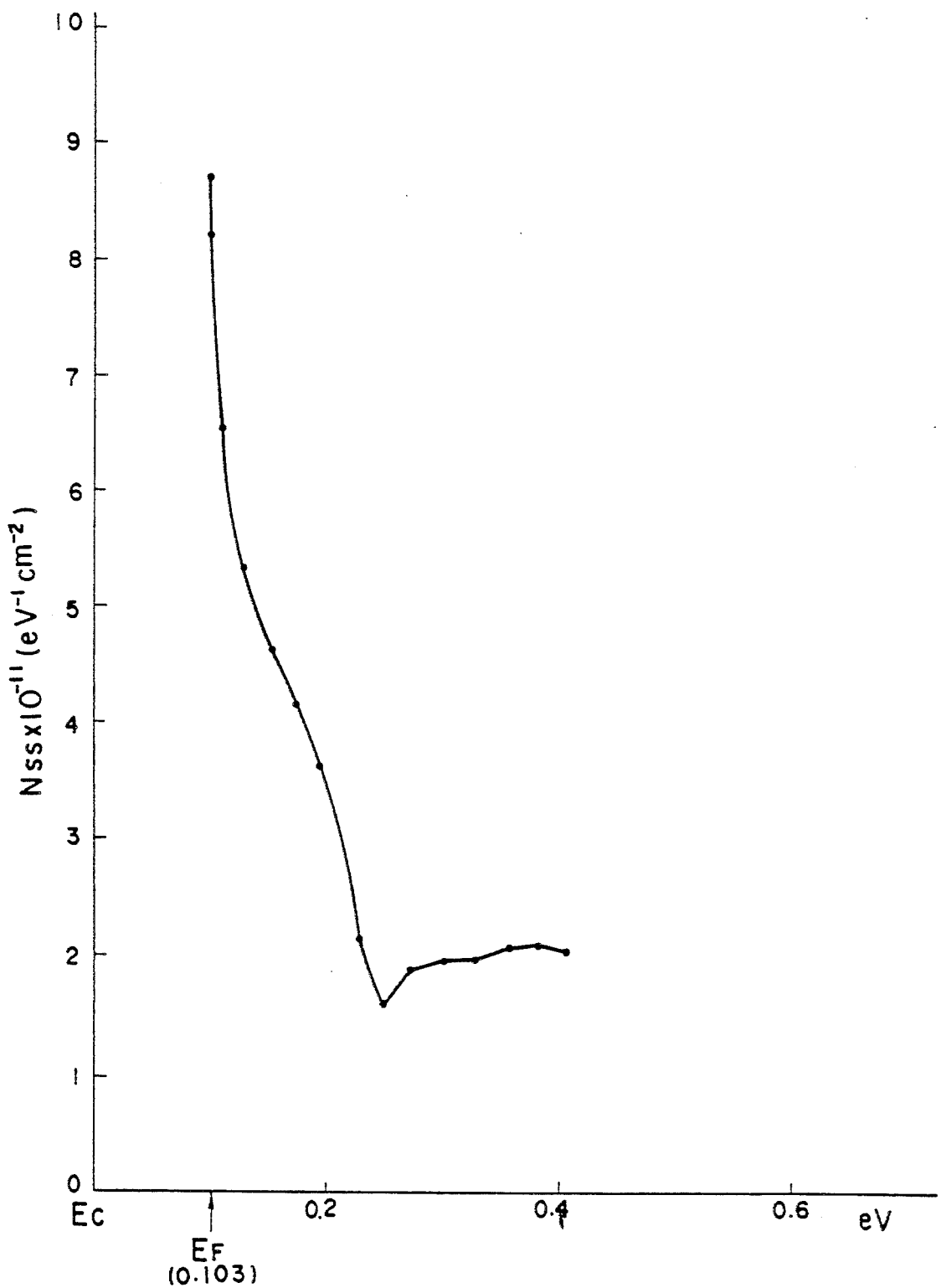
FIG. 4 is a graph showing the distribution of an interface trap density of the InP substrate produced by a method according to the present invention.

FIG. 3 shows the capacitance-voltage characteristic of MIS type diode produced by the above described method according to the second embodiment. FIG. 4 shows the distribution of interface trap density of InP substrate deduced from the capacitance-voltage characteristic curve.

As is clear from FIG. 4, the method of this second embodiment can provide the diode possessed of an extremely low interface trap density and an extremely desirable interface.

After the treatment, the insulating layer (InI PmOn) was possessed of a resistivity of $10^{15} \Omega$ cm or more.

Consequently, this embodiment can produce an improved MIS type diode possessed of excellent characteristics. In this method, a PxOy layer is formed on the InP substrate; the PxOy layer is subjected to heat treatment; PxOy and InP are reacted by this heat treatment and thus the interface is moved into the inner position. This moved interface may become a desirable interface. Further, some PxOy such as $P_2O_5$ are unstable on account of deliquescence, but they may become stable because they are changed to InI PmOn (l>0, m>0, n>0) by the heat treatment.

Since the PxOy layer includes some phosphorus, the layer prevents evaporation of phosphorus from the InP during the heat treatment.

Temperature for this heat treatment is desirable at highest 650 ° C. to prevent phosphorus as a high vapor pressure component from dissociating from the InP substrate.

In the above described embodiment, PxOy layer is deposited on the substrate by evaporation in an atmosphere of nitrogen. Though, the present invention is not limited to this method. For example, the layer may be formed by CVD method employing decomposition of $PCl_3$. Further, the layer may be deposited in an atmosphere of inert gas such as Ar or oxygen, or mixture of inert gas and oxygen. The heat treatment after the deposition of the insulating layer is not limited in only two steps of oxygen atmosphere and nitrogen atmosphere but also in a single step of oxygen atmosphere, or inert gas such as nitrogen atmosphere, or phosphoric gas such as $PH_3$ atmosphere, or combination thereof.

3. Third Embodiment

In this embodiment, a n-type InP substrate 1 possessed of a carrier density of about $7.3 \times 10^{15}$ cm$^{-3}$ is previously provided. After cleaning the InP substrate 1, an aluminium layer 2 having a thickness of 100 Å is deposited onto the front surface of this substrate by evaporation. Then the substrate is subjected to a heat treatment at 350° C. in an inert gas such as $N_2$ or Ar, or $H_2$, $PH_3$ or mixed gas thereof. The heat treatment is preferably continued for 30 minutes.

Figure 5A:
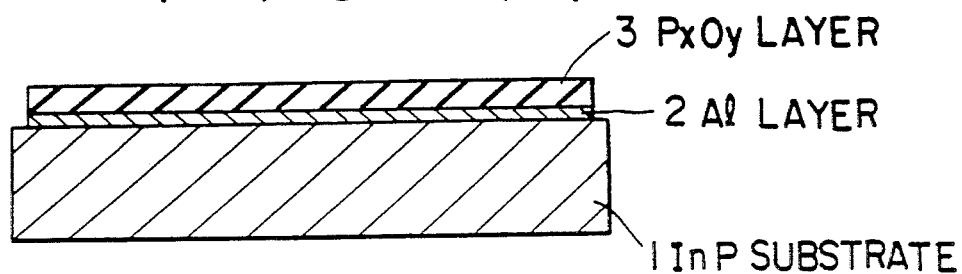
FIG. 5(A) to FIG. 5(C) are cross sectional views showing one example of the working steps ordered in the process for producing MIS type diode according to the present invention.
Figure 5B:
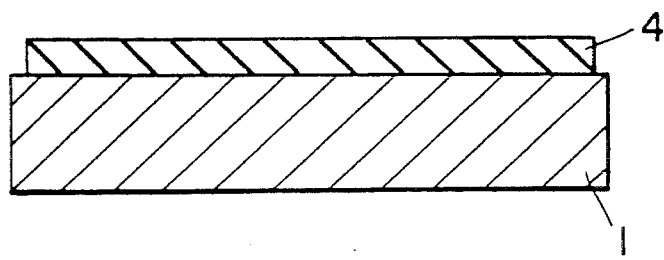

On the aluminium layer 2, a PxOy layer 3 having a thickness of about 1000 Å is deposited by a resistance heater employing $P_2O_5$ as a source in a nitrogen atmosphere as shown in FIG. 5(A). After forming the PxOy layer, the InP substrate 1 is subjected to heat treatment at temperature of 200° C. in oxygen atmosphere for about 60 minutes. Further the substrate 1 is subjected to additional heat treatment at a temperature of 400° C. for about 30 minutes in an atmosphere of an inert gas, $H_2$, $PH_3$, or mixed gas thereof. According to the two steps heat treatment, the PxOy layer 3, the aluminium layer 2 under the PxOy layer 3, and the InP substrate 1 are reacted to newly form an insulating layer 4 having a composition represented by AlPxOy or AlPxOyInz as shown in FIG. 5(B). Conditions for the above process are determined to ensure the whole thickness of the insulating layer 4 formed on the InP substrate 1 is about 1100 Å.

The method for forming the PxOy layer 3 is not limited to the above described process. But it is desirable that the PxOy layer 3 contains some water. The temperature and period for each heat treatment are based on thickness of the aluminium layer 2 and the PxOy layer 3, and/or the method for forming these layers. The suitable temperature and period may be determined in a experimental manner.

After forming the insulating layer 4, Au metal and Sn metal are deposited on the other surface of the InP substrate 1 by evaporation, and then subjected to a heat treatment at a temperature of 350° C. for about 10 minutes in $N_2$ gas. According to this step, an ohmic electrode 5 composed of Au—Sn layer is formed.

Figure 5C:
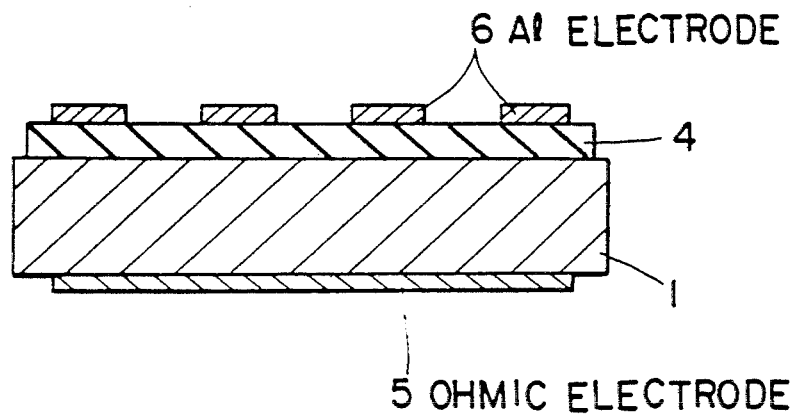

Further the insulating layer 4 is covered with an aluminium layer by evaporation. Then the aluminium layer is subjected to a patterning to form aluminium electrodes 6 whose diameter is 1 mm. As a result, a MIS type diode is produced as shown in FIG. 5(C).

Thus formed insulating layer 4 on the InP substrate was measured to obtain its resistivity. The resulted value was $5 \times 10^{15}$ Ω cm which means the insulating layer 4 is sufficient for the MIS type diode. The aluminium layer 2 may be replaced with an indium layer. In the case of InSb semiconductor, the indium layer may provide remarkable effect.

Figure 6:
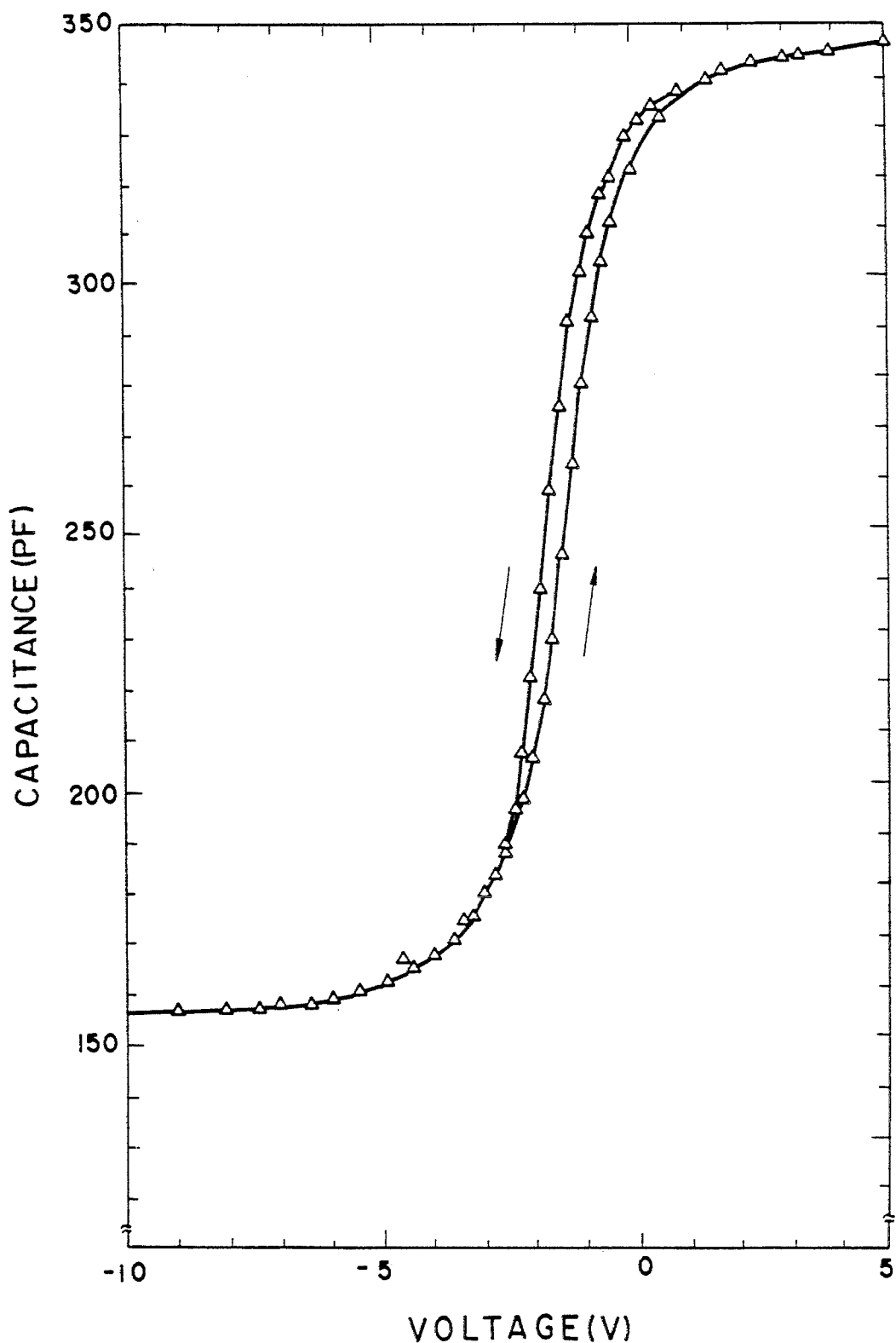
FIG. 6 is a graph showing the capacitance-voltage characteristic curve of MIS type diode produced by a method according to the present invention.

FIG. 6 shows the capacitance-voltage characteristic of MIS type diode produced by the above described method according to the third embodiment. This data was obtained at room temperature and under following conditions. AC signal frequency applied to the electrode was 100 kHz and its amplitude was 10 mV. Applied DC voltage was varied from 0 V to +2 V, and further varied to −10 V and finally returned to +5 V. Sweeping speed of applied voltage was about 4 mV/s and the measurement was conducted under essentially complete stationary conditions.

As is clear from the hysteresis loop of the capacitance-voltage characteristics shown in FIG. 6 of the MIS type diode produced by this embodiment, its shift width in the direction of the voltage axis is extremely small; i.e., 0.5 V or less. On the other hand, the diodes produced by conventional methods and provided with other types of insulating layers except for a phosphoric oxide insulating layer have provided a hysteresis loop with shift of at least 1 V under the essentially same measuring condition. This means the method disclosed in the present invention is extremely effective for decreasing drift phenomenon caused in MISFET composed of InP semiconductor substrate.

The MIS type diode produced by this embodiment provides a low interface trap density; $2 \times 10^{11}$ cm$^{-2}$ eV$^{-1}$ calculated by the Terman method, in comparison with conventionally produced diodes. This means an extremely desirable interface is formed.

The reasons why the MIS type diode with good capacitance-voltage characteristics and the MISFET with a high quality are produced by the methods according to the present invention are considered as follows. The AlPxOy or AlPxOyInz layer formed on the surface of the InP substrate is a good insulating layer for InP. The interface between the InP substrate and the insulating layer formed thereon proceeds into the inside of the InP substrate by the heat treatment after forming PxOy. The surface of the InP substrate is covered with an aluminium layer or the insulating layer including phosphorus during heat treatment at each step and thus the phosphorus component is prevented from volatilizing from the InP substrate by decomposition of InP so that the surface of the InP substrate can be free from harming by heat treatment.

Temperature for the heat treatment is desirably limited to 650° C. or less in order to prevent the phosphorus component, which is a high vapor pressure component, from dissociating from the InP substrate.

In this embodiment, the PxOy layer is formed by evaporation in an atmosphere of nitrogen. But the method for forming the PxOy layer is not limited to only this. For example, the layer may be formed by CVD method decomposing $PCl_3$, or by evaporation in not only nitrogen atmosphere but also inert gas such as Ar, or oxygen gas, or mixed atmosphere of inert gas and oxygen gas. The heat treatment after the deposition of the insulating layer is not limited in only two steps of oxygen atmosphere and nitrogen atmosphere but also in a single step of oxygen atmosphere, or inert gas such as nitrogen atmosphere, or phosphoric gas such as $PH_3$ atmosphere, or combination thereof.

As the above description, according to the first method of the present invention a PxOy insulating layer is formed on III-V group compound semiconductor substrate including indium and/or phosphorus, the substrate is subjected to heat treatment, and an electrode metal layer is formed on the insulating layer. This method provides an excellent interface condition between the insulating layer and the InP substrate. If the thickness of the insulating layer is 100 Å or less which means that electron can tunnel through the insulating layer, the InP substrate will be possessed of a high barrier height and a small ideal factor. Consequently this method ensures to produce a required Schottky diode possessed of a good forward current-voltage characteristic and decreased reverse leakage current and an excellent rectification. On the other hand, if the PxOy insulating layer is thicker than the above range, this method will produce an excellent -MIS diode.

According to the second method of the present invention, an aluminium layer or an indium layer is formed on III–V group compound semiconductor substrate including indium and/or phosphorus, the substrate is subjected to a first heat treatment, an insulating layer composed of phosphoric oxide PxOy ($x>0$, $y>0$) is formed on the aluminium layer, the substrate is subjected to a second heat treatment, and finally an electrode metal layer is formed on the insulating layer. The heat treatment ensures that the interface is moved between the insulating layer and the substrate and penetrates into the inside of the substrate crystal, and prevents the substrate surface from thermal-damaging because the insulating layer including aluminium and phosphorus or indium and phosphorus is stable. This causes a decrease in its interface trap density, and thus this method produces a required MIS diode possessed of decreased leakage current and decreased hysteresis of capacitance-voltage characteristic. As a result, the present invention ensures to production of a MIS type field-effect transistor with excellent characteristics.

USABLE ART IN INDUSTRIAL FIELD

As described above, the present invention provides an effective method adapted for producing a semiconductor device by forming a metal layer on a InP substrate through an insulating layer and/or a metal layer. However, the present invention is not only limited to the InP substrate, but also applied to III–V group compound semiconductor substrate including indium and/or phosphorus, and further commonly applied to compound semiconductor devices.

We claim:

1. A method for producing a semiconductor device characterized that an insulating layer is formed on III–V group compound semiconductor substrate including indium and/or phosphorus by evaporation employing $P_2O_5$ as a source, the substrate is subjected to a first heat treatment in an atmosphere of oxygen and then a second heat treatment in an atmosphere of inert gas, and an electrode metal layer is formed on the insulating layer.

2. A method for producing III–V group compound semiconductor device comprising the steps of forming an aluminium layer or an indium layer is formed on III–V group compound semiconductor substrate including indium and/or phosphorus, the substrate is subjected to a first heat treatment, an insulating layer composed of phosphoric acid $P_xO_y$ ($x>0$, $Y>0$) is formed on the aluminium layer or the indium layer, the substrate is subjected to a second heat treatment, and finally an electrode metal layer is formed on the insulating layer.

3. A method for producing a semiconductor device, comprising the steps of:
   forming a $P_xO_y$ ($x>0$, $y>0$) insulating layer on a III–V group compound semiconductor substrate including indium and/or phosphorus;
   subjecting the substrate having the insulating layer to a heat treatment; and
   forming an electrode metal layer on the insulating layer.

4. The method of claim 3, wherein the substrate is subjected to the heat treatment at a temperature of about 250° C.

5. A method for producing a III–V group compound semiconductor device, comprising the steps of:
   (a) forming an aluminium layer or an indium layer on a III–V group compound semiconductor substrate including indium and/or phosphorus;
   (b) subjecting the substrate to a first heat treatment;
   (c) forming an insulating layer composed of phosphoric oxide $P_xO_y$ ($x>0$, $y>0$) on the formed layer or the formed aluminum layer;
   (d) subjecting the substrate formed with the insulating later in (c) to a second heat treatment; and
   (e) forming an electrode metal layer on the insulating layer.

6. The method of claim 1, wherein said first heat treatment is carried out a temperature of 350° C. in an inert atmosphere for about thirty (30) minutes.

7. The method of claim 5, wherein the $P_xO_y$ layer has a thickness of 1000 Å and is subjected to said second heat treatment at a temperature of 200° C. in an oxygen atmosphere for about sixty (60) minutes.

8. The method of claim 5, including subjecting the substrate to an additional heat treatment at a temperature of 400° C. for about thirty (30) minutes in an inert atmosphere, whereby the $P_xO_y$ layer, the aluminum layer and the substrate are reacted to from a newly insulating layer having a composition AlPxOy or AlPxOyInz, the insulating layer having a thickness of 1100 Å.

9. The method of claim 5, including forming the other surface of the substrate by evaporating Au metal and Sn metal for deposit thereof onto the substrate and then subjecting the substrate to a heat treatment at a temperature of 350° C. for about ten (10) minutes in an inert atmosphere to form an ohmic electrode component of an Au—Sn layer.

* * * * *